(12) United States Patent
Andriessen et al.

(10) Patent No.: US 12,419,189 B2
(45) Date of Patent: Sep. 16, 2025

(54) PARTIALLY TRANSLUCENT PHOTOVOLTAIC WINDOW AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Hieronymus Antonius Josephus Maria Andriessen, Beerse (BE); Yulia Galagan, Taipei (TW); Henri Fledderus, Eindhoven (NL); Herbert Lifka, Eindhoven (NL)

(73) Assignee: Nederlandse Organisatie voor toegepast-natuurwetenschappelijk onderzoek TNO, 's-Gravenhage (NL)

(*) Notice: Subject to any disclaimer, the term of this patent is extended or adjusted under 35 U.S.C. 154(b) by 0 days.

(21) Appl. No.: 17/794,360

(22) PCT Filed: Jan. 26, 2021

(86) PCT No.: PCT/NL2021/050045
§ 371 (c)(1),
(2) Date: Jul. 21, 2022

(87) PCT Pub. No.: WO2021/154070
PCT Pub. Date: Aug. 5, 2021

(65) Prior Publication Data
US 2023/0050607 A1 Feb. 16, 2023

(30) Foreign Application Priority Data
Jan. 27, 2020 (EP) .................................. 20153934

(51) Int. Cl.
*H02S 20/26* (2014.01)
*H10F 19/80* (2025.01)
(Continued)

(52) U.S. Cl.
CPC ............ *H02S 20/26* (2014.12); *H10F 19/80* (2025.01); *H10K 50/846* (2023.02); *H10K 85/50* (2023.02)

(58) Field of Classification Search
CPC ... H02S 20/26; H01L 31/048; H01L 31/0481; H01L 31/0488; H10K 50/846; H10K 85/50; H10F 19/80
See application file for complete search history.

(56) References Cited

U.S. PATENT DOCUMENTS

2013/0061542 A1 3/2013 Weidner
2014/0165460 A1 6/2014 Blom et al.
(Continued)

FOREIGN PATENT DOCUMENTS

WO WO 2019/145927 A1 8/2019

OTHER PUBLICATIONS

European Patent Office, International Search Report in corresponding International Application No. PCT/NL2021/050045, dated Apr. 20, 2021 (4 pages).
(Continued)

*Primary Examiner* — Lindsey A Buck
(74) *Attorney, Agent, or Firm* — Leydig, Voit & Mayer, Ltd.

(57) ABSTRACT

A partially translucent photovoltaic window is provided herein that comprises a photovoltaic module enclosed between a first window pane and a second window pane. The photovoltaic module comprises a stack with at least a first electrode layer, a second electrode layer and a perovskite photovoltaic layer sandwiched between the electrode layers. The photovoltaic window further comprises between the first window pane and the photovoltaic module as well as between the second window pane and the photovoltaic module a respective intermediate layer comprising a lead getter material.

14 Claims, 6 Drawing Sheets

(51) Int. Cl.
*H10K 50/84* (2023.01)
*H10K 85/50* (2023.01)

(56) References Cited

U.S. PATENT DOCUMENTS

2018/0252028 A1* 9/2018 Wheeler .................. E06B 9/24
2020/0377533 A1 12/2020 Zhu et al.

OTHER PUBLICATIONS

J Sun et al., "Semi-Transparent Solar Cells," J. Phys. D: Appl. Phys. vol. 50, No. 9, pp. 1-28 (Feb. 3, 2017) XP020314253.
Yan Jiang et al., "Reduction of Lead Leakage from Damaged Lead Halide Perovskite Solar Modules Using Self-Healing Polymer-Based Encapsulation," Nature Energy, vol. 4, No. 7, pp. 585-593 (Jun. 17, 2019) XP036833106.
Feng Hao et al., "Anomalous Band Gap Behavior in Mixed Sn and Pb Perovskites Enables Broadening of Absorption Spectrum in Solar Cells," Journal of the American Chemical Society, vol. 136, No. 22, pp. 8094-8099 (May 13, 2014) XP055223209.
Giles E. Eperon et al., "Formamidinium Lead Trihalide: A Broadly Tunable Perovskite for Efficient Planar Heterojunction Solar Cells," Energy and Environmental Science, vol. 7, No. 3, pp. 982-988 (Jan. 1, 2014) XP055234624.
Derrick S. Dlamini et al., "Comparative Study of EVA-Cloisite® 20A and Heat-Treated EVA-Cloisite® 20A on Heavy-Metal Adsorption Properties," Department of Applied Chemistry, University of Johannesburg, Water SA, vol. 38, No. 4, pp. 519-528 (Sep. 11, 2012) XP055706912.

* cited by examiner

PARTIALLY TRANSLUCENT PHOTOVOLTAIC WINDOW AND METHOD OF MANUFACTURING THE SAME

CROSS-REFERENCE TO RELATED APPLICATIONS

This patent application is a U.S. National Phase of PCT International Application No. PCT/NL2021/050045, filed Jan. 26, 2021, which claims priority to European Application No. 20153934.3, filed Jan. 27, 2020, which are both expressly incorporated by reference in their entireties, including any references contained therein.

BACKGROUND

The invention relates to a partially translucent photovoltaic window.

The present invention further relates to a method of manufacturing a partially translucent photovoltaic window.

Perovskites are promising materials for application in photovoltaic devices as they facilitate low temperature manufacturing conditions have a relatively high conversion efficiency. A relatively new application is the incorporation of photovoltaic devices in a window. Therewith it can serve to absorb solar radiation for attenuation while at the same time converting the solar radiation into useful electrical energy. It is however a potential risk that in case the window is damaged, water can penetrate therein, dissolve solid state lead compounds to form $Pb^{2+}$ which is therewith distributed, which is an environmental and health risk.

SUMMARY

Accordingly, it is an object of the present disclosure to provide a partially translucent photovoltaic window that is improved to mitigate the abovementioned potential risk.

It is a further object of the present disclosure to provide a method of manufacturing the improved partially translucent, photovoltaic window.

A partially translucent photovoltaic window that is improved in accordance with the first mentioned object, is defined in claim 1.

The improved partially translucent photovoltaic window comprises a photovoltaic module enclosed between a first window pane and a second window pane. The photovoltaic module comprises a stack with at least a first electrode layer, a second electrode layer and a perovskite photovoltaic layer between said electrode layers. Between the first window pane and the photovoltaic module the photovoltaic window further comprises a first intermediate layer containing a lead getter material. Between the second window pane and the photovoltaic module the partially translucent photovoltaic window comprises a second intermediate layer containing a lead getter material.

In case that the partially translucent photovoltaic window is damaged and water penetrates therein, lead compounds dissolved therein are scavenged by the lead getter material in the intermediate layers and converted in a non-soluble substance therein. Therewith mitigating their environmental distribution in the period between the occurrence of the damage and the replacement of the window.

In an embodiment the lead getter material comprises one or more of sulphur or phosphor, Therewith lead is immobilized by conversion into insoluble leadsulfide or leadphosphate before it can penetrate through the intermediate layer.

The window is partially translucent, in that a portion (e.g. at least 30%) of incident radiation is transmitted, and another portion of the incident radiation is absorbed in the perovskite photovoltaic layer for conversion into electrical energy.

In an embodiment the portion absorbed for conversion may for example have a substantially uniform distribution, over the visible spectrum. Therewith, perception of colors in a scene through the window is substantially the same as it would be in the absence of the window.

Alternatively, the portion absorbed for conversion may have a non-uniform distribution over the visible spectrum. For example for application in a greenhouse the photovoltaic window radiation having a wavelength in the range of 500-600 nm may be almost completely absorbed for conversion into electric energy, whereas radiation outside this range may be substantially transmitted. In particular it is favorable for this application that radiation in the subranges of 350-500 nm and 600-700 nm, which is important for photosynthesis is substantially transmitted.

In another embodiment the portion absorbed for conversion may have a non-uniform spectral distribution in that in particular solar radiation having a relative wavelength, e.g. more than, 700 nm is strongly absorbed for conversion. A photovoltaic window of this type may serve for example in buildings to mitigate heating by solar radiation.

To achieve that incident light is optimally used for illumination of a room and for conversion into electrical energy, it is preferably the case that all elements of the photovoltaic window other than the perovskite photovoltaic layer are substantially translucent, e.g. in that at most 10% of incoming radiation is absorbed anywhere in these layers on its way through the window.

Typically it is also desired that the photovoltaic window is also transparent, to enable vision through the window. However, in other cases it is sufficient that the window is merely partially translucent, but not transparent. In that case it may have the appearance of frosted glass. For application in greenhouses as specified above, this will often be sufficient. Also in buildings such translucent, non-transparent windows may serve where access of solar light is required but transparency is not required in view of privacy.

In an embodiment at least one of the respective intermediate layers is of an elastic polymer, which has the lead getter material dispersed therein. The elastic polymer reduces the risk of damage, and/or minimizes the impact of damage to the window by maintain integrity. Therewith a synergic effect is achieved in that the intermediate layer serves a dual purpose. When maintaining integrity in a damaged window penetration of water is mitigated. Also outward diffusion of water is mitigated therewith increasing a time of contact between the dissolved lead compounds and the lead getter material.

A method of manufacturing the improved partially translucent photovoltaic window is specified in claim 10.

The improved method of manufacturing provides the partially translucent photovoltaic window as a layered product. The layered product subsequently comprises:
- a first window pane;
- a first intermediate layer comprising a lead getter material;
- a photovoltaic module comprising a stack with at least, a first, electrode layer, a second electrode layer and a perovskite photovoltaic layer between said electrode layers,
- a second intermediate layer comprising a lead getter material;
- a first window pane.

BRIEF DESCRIPTION OF THE DRAWINGS

These and other aspects are described in more detail with reference to the drawing. Therein.

DETAILED DESCRIPTION OF EMBODIMENTS

Figure 1:
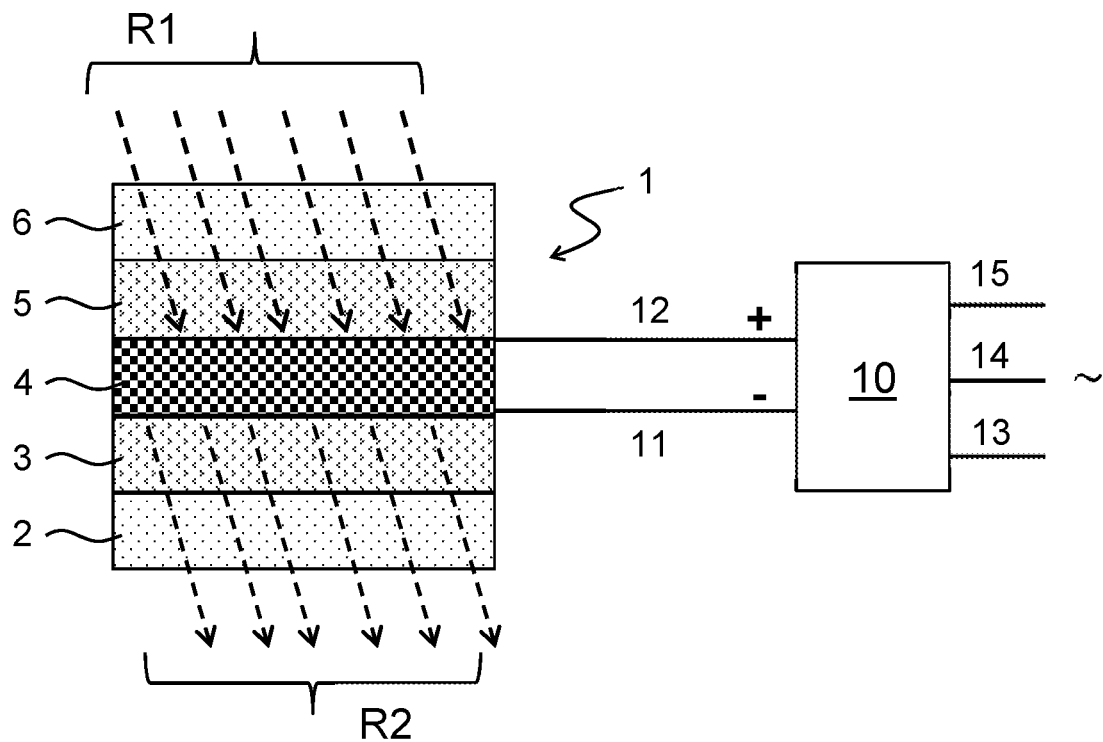
FIG. 1 schematically shows an embodiment of the improved partially translucent photovoltaic window as provided herein, FIG. 1A schematically shows an aspect thereof in more detail, FIG. 2A-2C schematically shows a functioning of the partially translucent photovoltaic window in case of damage, FIG. 3A-3C schematically show a first method of manufacturing the partially translucent photovoltaic window, FIG. 4A-4B schematically show a first method of manufacturing the partially translucent photovoltaic window, FIG. 5, 5A schematically show an exemplary application of improved partially translucent photovoltaic window, FIG. 6 schematically shows another exemplary application of the improved partially translucent photovoltaic window.

Like reference symbols in the various drawings indicate like elements unless otherwise indicated.

In the following detailed description numerous specific details are set forth in order to provide a thorough understanding of the present invention. However, it will be understood by one skilled in the art that the present invention may be practiced without, these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Figure 1A:
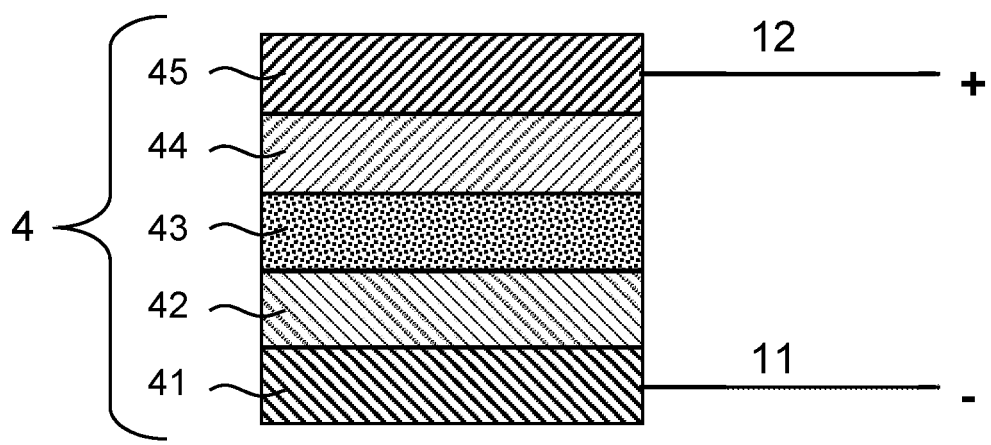

FIG. 1 schematically shows a partially translucent photovoltaic window 1 that comprises a photovoltaic module 4 enclosed between a first window pane 2 and a second window pane 6. As shown further in FIG. 1A, the photovoltaic module 4 comprises a stack with at least a first electrode layer 41 (here a cathode), a second electrode layer 45 (anode) and a perovskite photovoltaic layer 43 between said electrode layers. In the example shown, additionally an electron transport layer 42 is provided between the first electrode layer 41 and the photovoltaic layer 43. Also a hole transport layer 44 is provided between the second electrode layer 45 and the photovoltaic layer 43. The photovoltaic window 1 further comprises a first intermediate layer 3 between the first window pane 2 and the photovoltaic module 4. The photovoltaic window 1 still further comprises a second intermediate layer 5 between the second window pane 6 and the photovoltaic module 4. The first and the second intermediate layer 3, 5 comprise a lead getter material.

In the embodiment shown the first and the second electrode layer 41, 45 of the photovoltaic module 4 are connected via electric conductors 11, 12 to a power converter 10 that is connected via a further set of conductors 13, 14, 15 to a mains network. In normal use, daylight R1 is partly absorbed and converted into electrical energy and delivered by the power converter 10 via the further set of conductors 13, 14, 15 to the mains network. Alternatively the generated electrical energy may be used in a local DC network, for example to charge battery. A portion R2 of the daylight R1 protrudes through the partially translucent photovoltaic window 1 so as to serve as an attenuated illumination of an interior. To that end all parts of the partially translucent photovoltaic window 1, except the perovskite photovoltaic layer 43, are typically highly translucent. E.g. the window panes 2, 6 may be provided of a glass which is conventional in window applications and electrode layers 41, 45, the electron transport layer 42, the hole transport layer 44, as well as the intermediate layers 3, 5 are highly translucent, e.g. preferably have a translucency in the visible wavelength range of at least 50%. That is to say that at least half of the total solar power within a wavelength range of about 380 to about 740 nm impingent on the photovoltaic window reaches the photovoltaic layer 43. More preferably the translucency is at least 75% and still more preferably it is at least 90%.

The partially translucent photovoltaic window 1 may be transparent, but in some applications that is not necessary or may not be desired.

It is noted that additional layers may be present, as sublayers of the above-mentioned layers, or as additional layers. For example, it may be contemplated to include a further electro-optical layer stack. Such a further electro-optical layer stack may for example serve to allow a user to electrically control a transparency of the partially translucent photovoltaic window 1. This allows the user to change an appearance of the window 1 between transparent and opal, or in an intermediate state. In an other example an electro-optical layer stack may serve for conversion of electrical energy into light. Therewith the window 1 can serve as an active source of light in the absence of daylight. Also combinations of various electro-optical layer stacks may be provided.

By way of example the window panes 2, 6 may be of any glass which is known for use in conventional windows. The panes may for example have a thickness of a few mm. Alternatively, one or both window panes 2, 6 may made of a resin such as polyethylene terephthalate (PET), polyethylene naphthalate (PEN), polyimide (PI), polyetherimide (PET), polyethersulfone (PES), polysulfone (PSF), polyphenylene sulfide (PPS), polyether ether ketone (PEEK), polyarylate (PAR), and polyamide-imide (PM). Other resin materials include polycycloolefin resin, acrylic resin, polystyrene, ABS, polyethylene, polypropylene, polyamide resin, polyvinyl chloride resin, polycarbonate resin, polyphenyleneether resin and cellulose resin, etc. In case a resin is used for the window panes 2, 6, it may be contemplated to provide these with a moisture, oxygen) barrier coating, for example comprising one or more inorganic layers.

Such resin materials may also be contemplated as a matrix for the intermediate layers 3, 5. A lead getter material may be dispersed therein as finely distributed particles, e.g. Sulphur or phosphor particles.

Regarding the photo-voltaic module 4, the perovskite materials therein typically have a crystal structure of $ABX_3$, wherein A is an organic cation as methylammonium $(CH_3NH_3)^+$, B is an inorganic cation, usually lead (II) ($Pb^{2+}$), and X is a halogen atom such as iodine ($I^-$), chlorine ($Cl^-$), fluorine ($F^-$) or bromine ($Br^-$). Perovskite materials are particularly advantageous in that they can be processed relatively easily and in that their bandgap can be set to a desired value by a proper choice of the halide content. One of examples is methylammonium lead trihalide ($CH_3NH_3PbX_3$), with an optical bandgap between 1.5 and 2.3 eV depending on halide content. Other more complex structures contain mixed A cations, such as Cesium (Cs+), methylammonium ($(CH_3NH_3)+$, MA), formamidinum ($(H_2NCHNH_2)+$, FA), or rubidium (Rb+) and mixed X anions. The examples of complex mixed perovskites are Cesium formamidinum lead trihalide $Cs_xFA_{1-x}PbI_yBr^{3-y}$ and Cesium Methylamonium formamidinum lead trihalide $Cs_{x-}MA_zFA_{1-x-z}PbI_yBr_{3-y}$ (where x<1, z<1, x+z<1). WIth the A-cations and X-anions ratio the bandgap and the physical properties of perovskite materials can be tuned. Other metals such as tin may replace the role of Ph in the B position of perovskite materials. An example thereof is $CH_3NH_3SnI_3$. Also combinations of Sn with Pb perovskites having a wider bandgap in the range of 1.2 to 2.2 eV are possible. A perovskite photovoltaic layer 43 may have a thickness in the range of 100 nm to 20 micron for example.

A translucent electrically conductive material for use in the first and the second electrode layers 41, 45 may be of an organic or an inorganic nature. Examples of organic translucent (transparent) electrically conductive materials are polyaniline, polythiophene, polypyrrole or doped polymers. Examples of inorganic translucent (transparent) electrically conductive materials are ITO (Indium Tin Oxide), IZO (Indium Zinc Oxide), ATO (Antimony Tin Oxide), or Tin Oxide can be used. Other metal oxides can work, including but not limited to Nickel-Tungsten-Oxide, Indium doped Zinc Oxide, Magnesium-Indium-Oxide. Also (combinations of) a thin metal layer, an oxide layer, or other e.g. a TCO or a metal oxide layer or a conducting polymer layer, such as PEDOT-PSS may be used. For example a 7 nm layer of Silver may be sandwiched in between two 10 nm ITO layers. The transparent electrically conductive electrode layer may have a total thickness in the range of a few tens of nm to a few hundreds of nm, for example in a range between 100 and 200 nm, for example about 120 nm.

As noted above, one or more charge carrier transport layers may be provided. For example a hole transport layer, here the charge carrier transport layer 44, such as a nickel-oxide layer or a MoSe layer, may be provided between the anode (here layer 45) and the photovoltaic layer 43. Further examples of hole transport materials for a hole transport layer have been summarized for example, in Kirk-Othmer. Encyclopedia of Chemical Technology Fourth Edition, Vol. 18, p. 837-860, 1996, by Y. Wang. Both hole transporting molecules and polymers can be used. In an embodiment a hole transport layer may have a thickness in the range of 10 to 200 nm. Additionally, an electron transport layer here the layer 42 may be provided between the cathode (here 41) and the photovoltaic layer 43. Suitable materials for this purpose are for example $TiO_2$, $SnO_2$, $ZrO_2$ and ZnO: The electron transport layer may have a thickness in the range of a few nm to a few tens of nm.

Figure 2A:
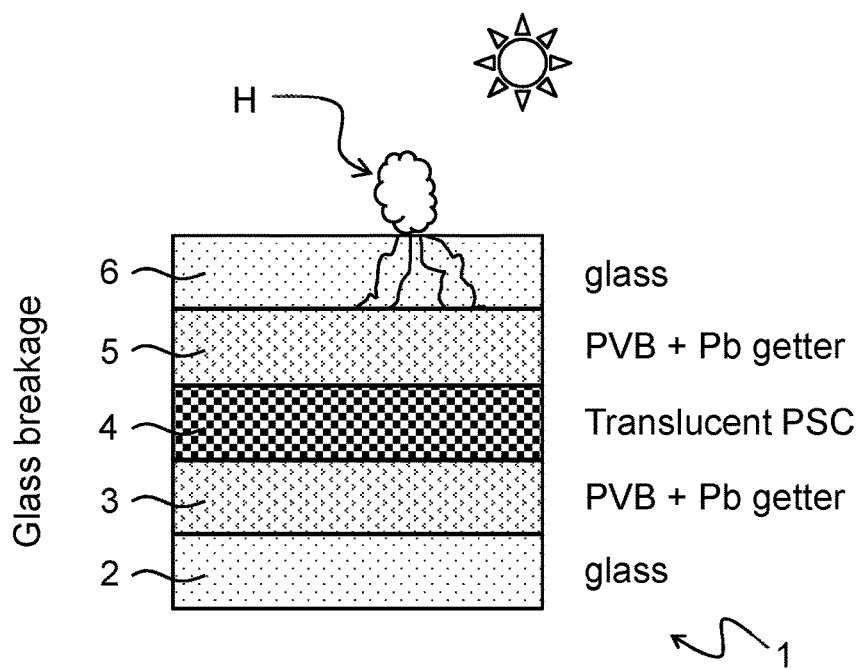
Figure 2B:
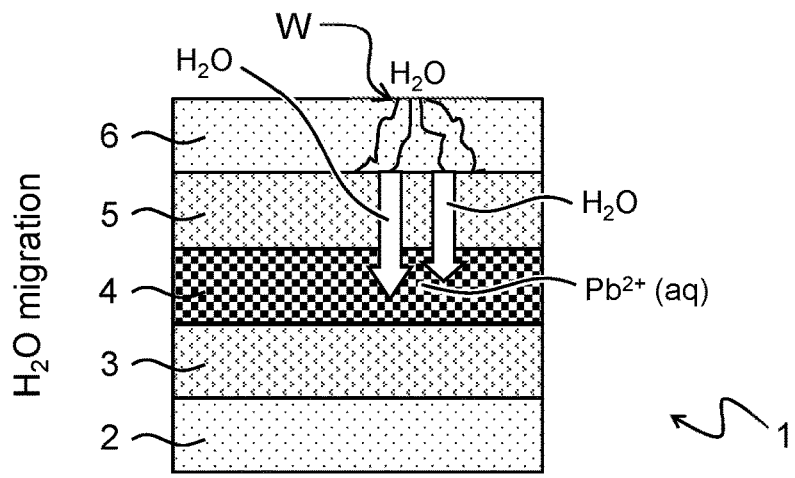

FIG. 2A shows an exceptional case wherein the window is damaged, for example due to a hailstone H incident on window pane 6. As shown in FIG. 2B, water W could penetrate trough the damaged portion of the window pane 6 into the photovoltaic module 4. Solid state lead compound (in the form of perovskite crystals or potentially by products like $PbI_2$ could then dissolve in the penetrated water to form $Pb^{2+}$ ions.

Figure 2C:
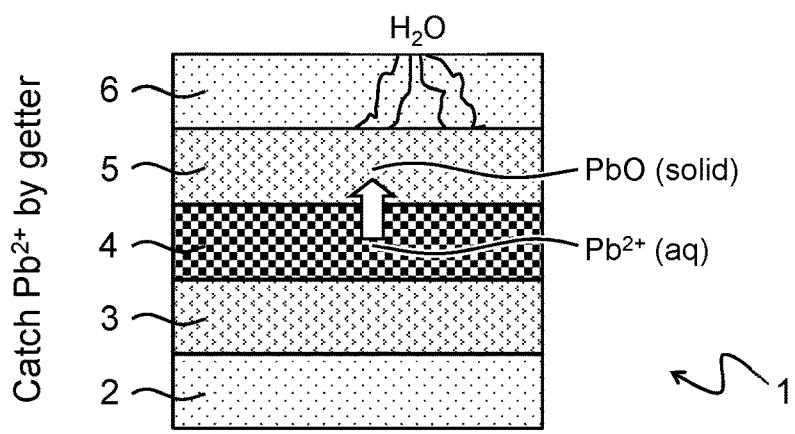

As shown in FIG. 2C, in the partially translucent photovoltaic window 1 as provided herein, water having dissolved therein $Pb^{2+}$ ions that migrates outward the photovoltaic module 4 enters an intermediate layer, here the second intermediate layer 5, wherein the dissolved lead ions react with the getter material and form an insoluble product, e.g. PbO. Therewith distribution of lead originating from the perovskite photovoltaic layer 43 into the environment is mitigated also in case the window 1 is damaged.

By way of example, phosphor may be provided as the lead getter material. Dissolved lead ions or lead containing ions in contact therewith react to insoluble leadphosphate and are therewith immobilized. As another example Sulphur may be provided as the lead getter material. The latter immobilizes lead components as insoluble leadsulfides. Also combinations of lead getter materials may be used.

In a first example, the dissolved $Pb^{2+}$ ions react with monohydrogen-phosphate to form an insoluble phosphate compound as follows.

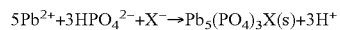
$$5Pb^{2+}+3HPO_4^{2-}+X^-\rightarrow Pb_5(PO_4)_3X(s)+3H^+$$

Therein the negative ion $X^-$ is for example one of $OH^-$, $F^-$, $Cl^-$, so that the insoluble reaction product is leadhydroxyphosphate ($Pb_5(PO_4)_3OH$), leadchlorophosphate ($Pb_5(PO_4)_3Cl$) or leadfluorophosphate ($Pb_5(PO_4)_3Cl$).

Instead of using the monohydrogen-phosphate ion in the getter material, alternatively the dihydrogen-phosphate ion may be used in the following reaction:

$Pb^{2+}+3H_2PO_4^-+X^-(X=OH,F,Cl)\rightarrow Pb_5(PO_4)_3X(s)+6H^+$.
Likewise, the negative ion $X^-$ is for example one of $OH^-,F^-,Cl^-$, so that the insoluble reaction product is leadhydroxyphosphate ($Pb_5(PO_4)_3OH$), leadchlorophosphate ($Pb_5(PO_4)_3Cl$) or leadfluorophosphate ($Pb_5(PO_4)_3Cl$).

In a second example, the dissolved $Pb^{2+}$ ions react with a sulphide ions $S^{2-}$ to form insoluble lea dsulphide as follows.

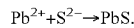
$$Pb^{2+}+S^{2-}\rightarrow PbS.$$

In the embodiment of the photovoltaic window 1 shown in FIG. 1 the intermediate layers 3, 5 are of an elastic polymer. The lead getter material is dispersed therein as particles, e.g. nanometer sized particles. The embodiment wherein at least, one of the intermediate layers 3, 5 is provided as an elastic polymer helps to prevent a damage of the window 1 or in case a damage does occur, helps to maintain integrity of the window 1, so that removal of a damaged window is more easy.

In an example, the elastic polymer is an adhesive, One example thereof is Polyvinyl butyral (or PVB).

Figure 3A:
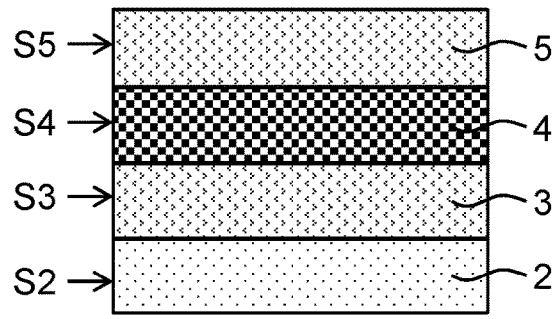
Figure 3B:
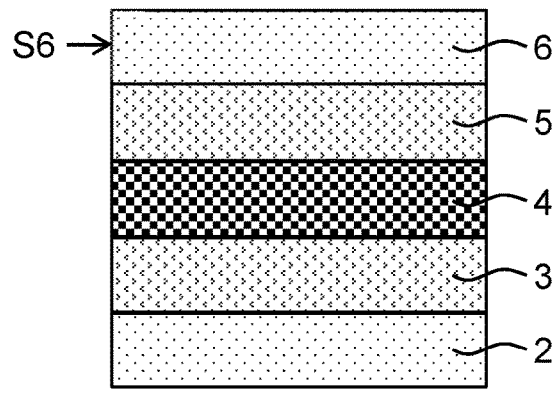
Figure 3C:
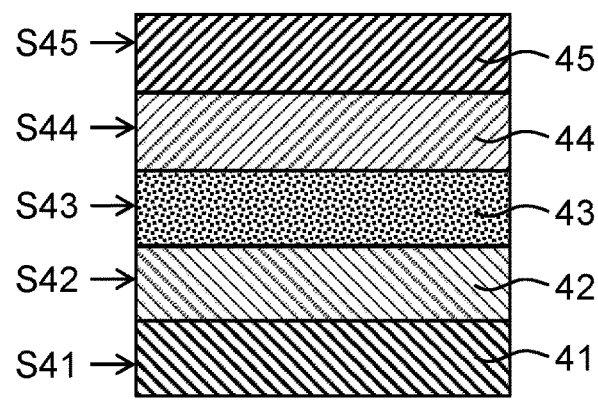

FIG. 3A-3C schematically show a method of manufacturing a partially translucent photovoltaic window 1 as a layered product. The method comprises a step S2 wherein a first window pane 2 is provided. The first window pane 2 here serves as a substrate on which subsequently a stack of layers is provided. In step S3 a first intermediate layer 3 comprising a lead getter material is provided on the first window pane 2. Subsequently in step S4, layers of a photovoltaic module 4 are provided. As shown in more detail in FIG. 3D, in this example step S4 comprises sub-steps S41-S45 as follows.

In the first sub-step S41 of step S4 a first electrode layer 41, for example a cathode, is provided on the first intermediate layer 3.

In the second sub-step S42 of step S4 a first charge carrier transport layer 42, for example an electron transport layer is provided on the first electrode layer 41.

In the third sub-step S43 of step S4 a perovskite photovoltaic layer 43, is provided on the first charge earner transport layer 42.

In the fourth sub-step S44 of step S4 a second charge carrier transport layer 44, for example a hole transport layer is provided on the perovskite photovoltaic layer 43.

In the fifth sub-step S45 of step S4 a second electrode layer 45, for example an anode, is provided on the second charge carrier transport layer 44.

Subsequently in step S5 a second intermediate layer 5 comprising a lead getter material is provided on the photovoltaic module 4.

Then, in a next step S6, the intermediate product so obtained is laminated with a second window pane 6.

It is noted that various technologies are available for providing a layer in the steps referred to above. Various methods may be used for depositing and applying layers. Example of these methods may include spin-coating, printing methods, slot-die coating and vapor deposition methods like physical vapor deposition (e.g. E-beam PVD, Sputter PVD), (spatial) Atomic Layer Deposition ((s)ALD) and the like.

Figure 4A:
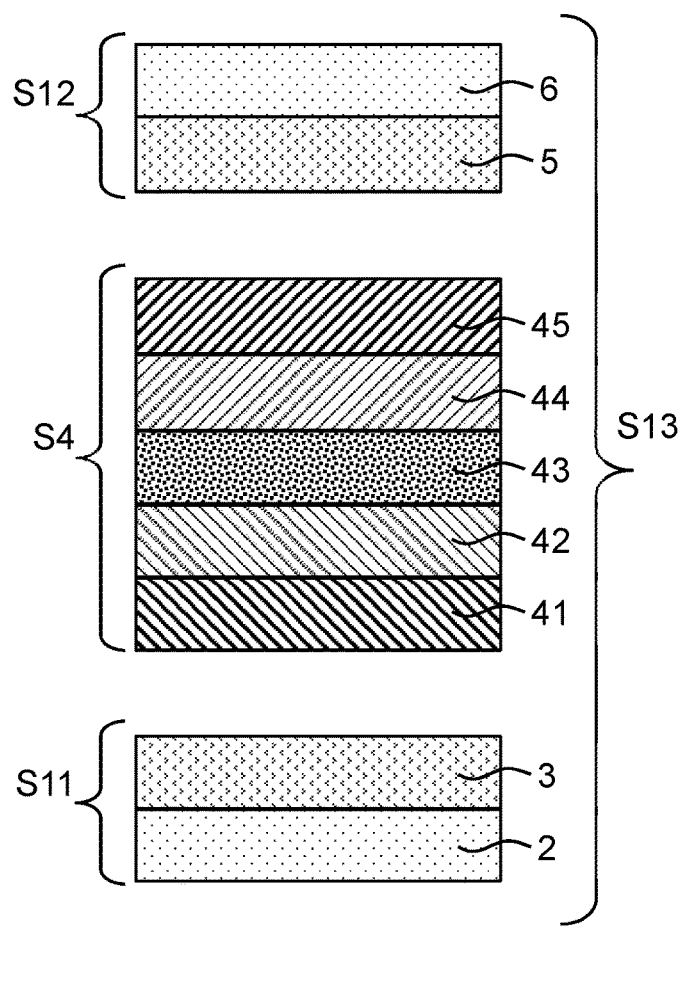
Figure 4B:
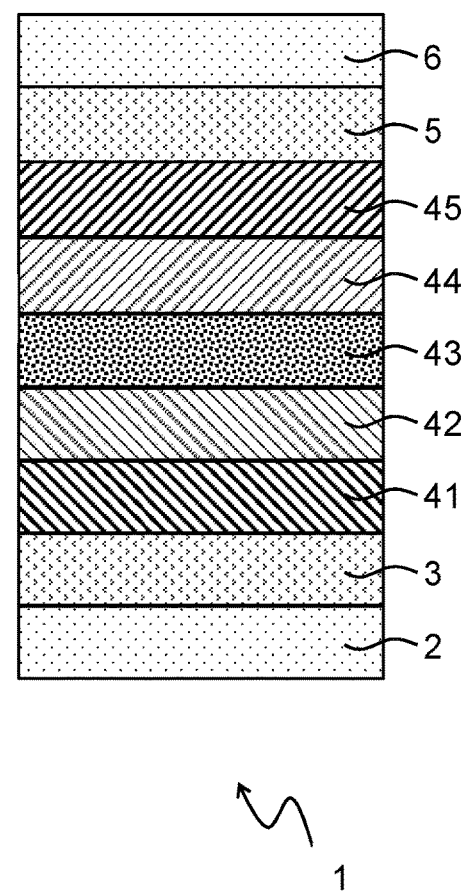

Another exemplary method of manufacturing is depicted in FIG. 4A, 4B.

FIG. 4A shows a preparatory step S4 having sub-steps S41-S45 as shown in FIG. 3C, wherein a photovoltaic module 4 is provided that comprises a stack with at least a first electrode layer 41, a second electrode layer 45 and a perovskite photovoltaic layer 43 between said electrode layers. In preparatory sub-step S11, the first window pane 2 having the first intermediate layer 3 is provided and in preparatory sub-step S12, the first window pane 6 having the second intermediate layer 5 is provided. In subsequent step S13 the intermediary products obtain in preparatory steps S4, S11 and S12 are laminated into the partially translucent photovoltaic window 1 shown in FIG. 4B.

Figure 5:
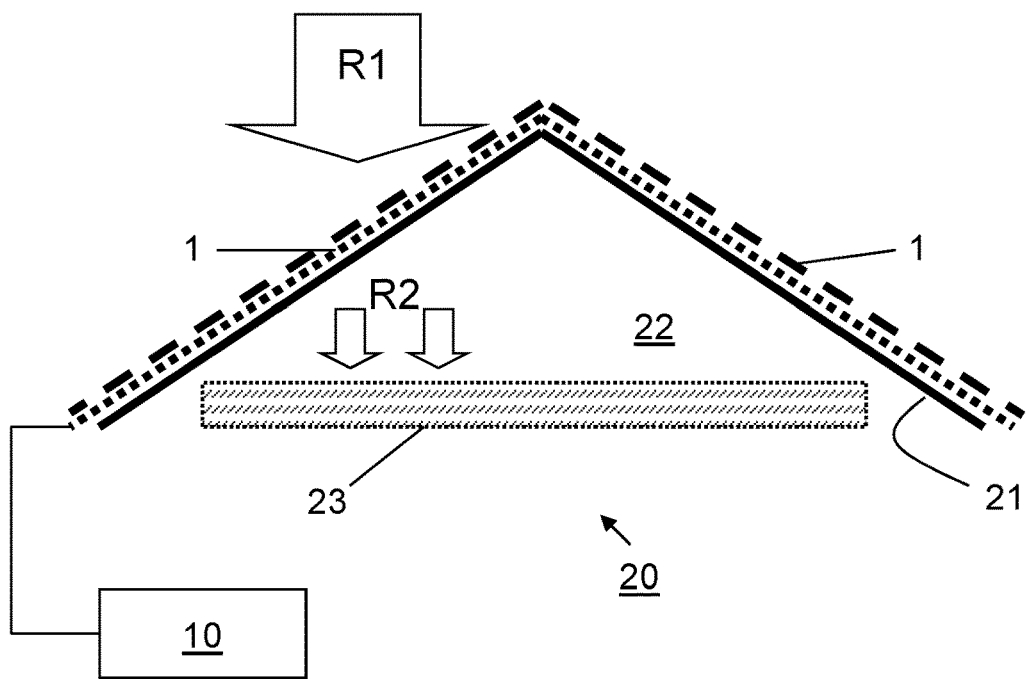
Figure 5A:
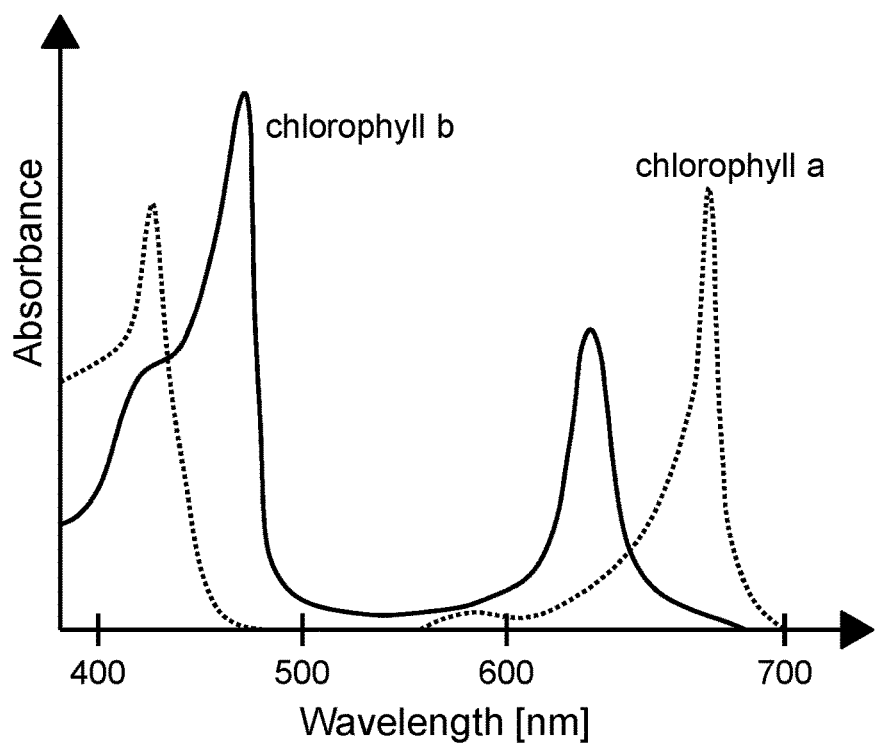

FIG. 5 schematically shows a greenhouse 20 provided with a roof 21 formed by partially translucent photovoltaic windows 1 as shown in FIG. 1, or being covered therewith. The greenhouse 20 shown in FIG. 3 encloses an inner space 22 for growing plants 23. In this embodiment, the photovoltaic windows 1 comprised in the roof 21, or from which the roof is constructed has a photovoltaic module 4, wherein the perovskite photovoltaic layer 43 has a relative high absorption for radiation with a wavelength in the range of 500-600 nm, and has a relatively low absorption radiation for visible radiation outside this range. In particular it has a relatively low absorption for visible radiation in the sub-ranges of 350-500 nm and 600-700 nm. Therewith the spectrum of the transmitted radiation R2 optimally matches the requirements for photosynthesis, as is illustrated by the sensitivity curves of chlorophyl-a and chlorophyl-b shown in FIG. 5A.

Figure 6:
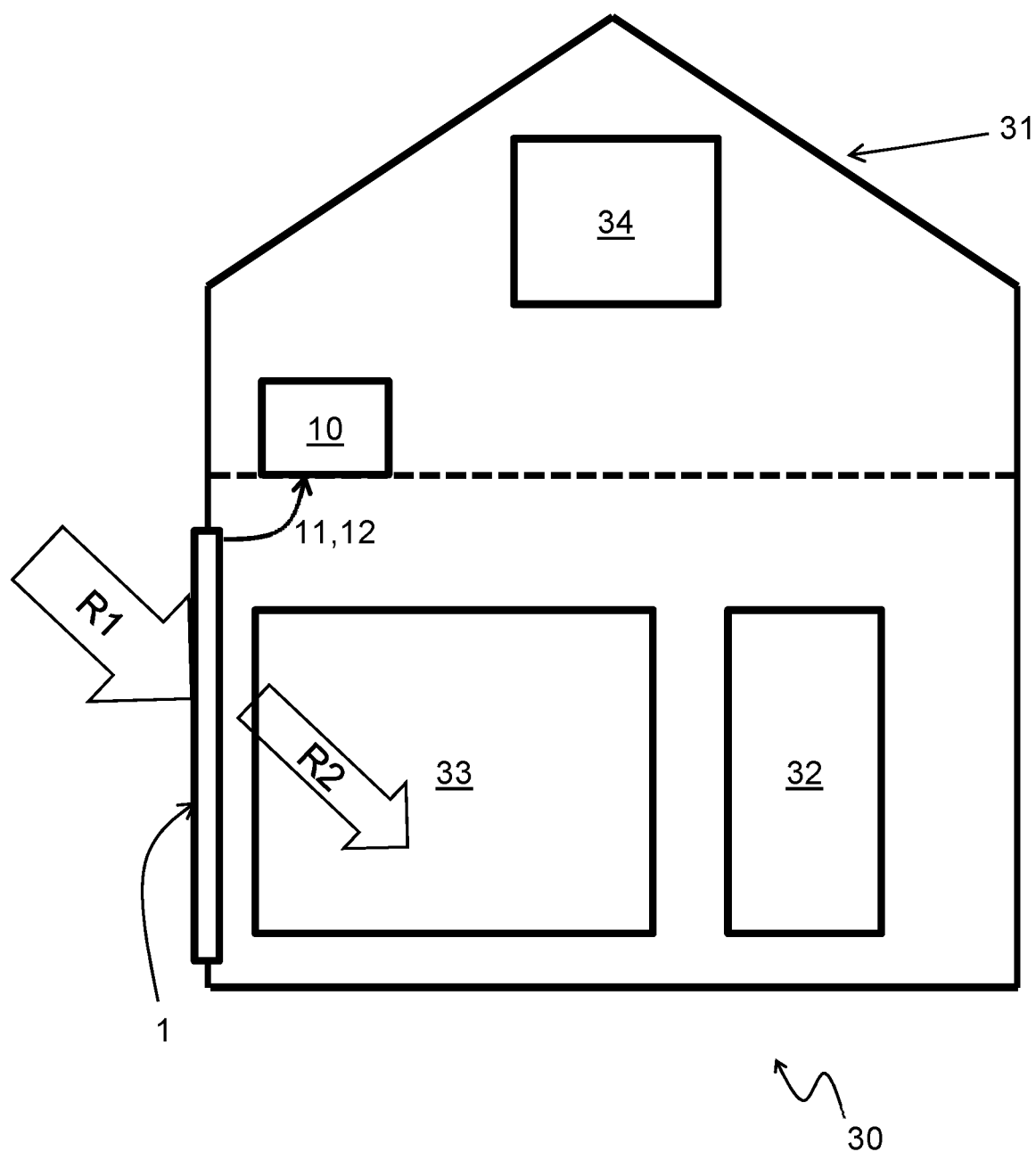

FIG. 6 schematically shows a house 30 having a roof 31, front door 32, windows 33, 34 and further having an embodiment of partially translucent photovoltaic window 1 as shown in FIG. 1. The photovoltaic window 1 may be transparent, but may alternatively be opal, or may be controllably switched in either one of a transparent state or an opal state. The perovskite photovoltaic layer 43 (See FIG. 1A) may have an absorption with a substantially uniform distribution over the visible spectrum, so that solar radiation R1 impingent on the window 1 is attenuated as R2, hut gives the same color impression. Optionally the perovskite photovoltaic layer 43 may have a relatively high absorption for radiation having a wavelength greater than 700 nm, to mitigate an undue heating of the interior of the house.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true present), and both A and B are true or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The invention claimed is:

1. A partially translucent photovoltaic window, comprising:
   a first window pane;
   a second window pane; and
   a photovoltaic module enclosed between the first window pane and the second window pane,
   wherein the photovoltaic module comprises a stack including:
     a first electrode layer,
     a second electrode layer, and
     a perovskite photovoltaic layer between the first electrode layer and the second electrode layer;
   wherein the photovoltaic window further comprises, between the first window pane and the photovoltaic module and between the second window pane and the photovoltaic module, respective intermediate layers,
   wherein each of the respective intermediate layers comprise a lead getter material that is configured to scavenge lead compounds dissolved in water and to convert the lead compounds into a non-soluble substance,
   wherein the perovskite photovoltaic layer has:
     an absorption with a substantially uniform distribution over the visible light spectrum, and
     a relatively high absorption for radiation having a wavelength greater than 700 nm as compared to an absorption for radiation in the visible spectrum.

2. The partially translucent photovoltaic window according to claim 1, wherein at least one of the respective intermediate layers is an elastic polymer, having the lead getter material dispersed therein.

3. The partially translucent photovoltaic window according to claim 2, wherein the elastic polymer is an adhesive.

4. The partially translucent photovoltaic window according to claim 1, wherein the lead getter material comprises phosphor and/or sulphur.

5. The partially translucent photovoltaic window according to claim 1, wherein the photovoltaic window is transparent.

6. A building comprising one or more of the partially translucent photovoltaic window according to claim 5.

7. The partially translucent photovoltaic window according to claim 2, wherein the lead getter material comprises phosphor and/or sulphur.

8. A building comprising one or more of the partially translucent photovoltaic window according to claim 1.

9. A building comprising one or more partially translucent photovoltaic window according to claim 2.

10. The partially translucent photovoltaic window according to claim 1, wherein the first electrode layer and the second electrode layer are each provided with at least one electrode layer type taken from the group consisting of:
- at least one type of translucent electrically conductive layer made of a material type taken from the group consisting of:
  - an organic material type taken from the group consisting of polyaniline, polythiophene, polypyrrole and doped polymers; and
  - an inorganic material selected from the group consisting of ITO (Indium Tin Oxide), IZO (Indium Zinc Oxide), ATO (Antimony Tin Oxide), Tin Oxide, Nickel-Tungsten-Oxide, Indium doped Zinc Oxide, and Magnesium-Indium-Oxide; and
- a metal layer having a thickness of at most 7 nm.

11. The partially translucent photovoltaic window according to claim 1 that is non-transparent.

12. The partially translucent photovoltaic window according to claim 1, further comprising:
a further electro-optical layer stack for electrically controlling a transparency of the partially translucent photovoltaic window to enter a transparent state.

13. The partially translucent photovoltaic window according to claim 1, further comprising:
a further electro-optical layer stack for electrically controlling a transparency of the partially translucent photovoltaic window to enter an opaque state.

14. The partially translucent photovoltaic window according to claim 1, further comprising:
a further electro-optical layer stack for electrically controlling a transparency of the partially translucent photovoltaic window to enter an intermediate state.

* * * * *